United States Patent
Choi et al.

(10) Patent No.: US 12,321,001 B2
(45) Date of Patent: Jun. 3, 2025

(54) METHOD OF PREPARING A POLARIZING PLATE FOR ANTIREFLECTION

(71) Applicant: DONGWOO FINE-CHEM CO., LTD., Iksan-si (KR)

(72) Inventors: Dongduk Choi, Bucheon-si (KR); Jihoon Kong, Siheung-si (KR); Ji Hoon Kim, Hwaseong-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 18/531,308

(22) Filed: Dec. 6, 2023

(65) Prior Publication Data

US 2024/0111082 A1 Apr. 4, 2024

Related U.S. Application Data

(62) Division of application No. 17/404,524, filed on Aug. 17, 2021, now abandoned.

(30) Foreign Application Priority Data

Aug. 18, 2020 (KR) .................. 10-2020-0103556

(51) Int. Cl.
*G02B 5/30* (2006.01)
*B32B 37/12* (2006.01)
(Continued)

(52) U.S. Cl.
CPC .............. *G02B 5/305* (2013.01); *B32B 37/12* (2013.01); *G02B 1/11* (2013.01); *G02B 1/14* (2015.01);
(Continued)

(58) Field of Classification Search
CPC ............ G02F 1/133528; G02F 1/13363; G02F 1/133638; G02B 5/3025; G02B 5/3033; G02B 5/3083; H10K 50/86; H10K 50/868
See application file for complete search history.

(56) References Cited

U.S. PATENT DOCUMENTS

| 2006/0268200 A1 | 11/2006 | Ohgaru et al. |
| 2007/0146887 A1 | 6/2007 | Ikeda et al. |

(Continued)

FOREIGN PATENT DOCUMENTS

| JP | 2003-307625 A | 10/2003 |
| JP | 2004-20632 A | 1/2004 |

(Continued)

OTHER PUBLICATIONS

Office Action issued Aug. 31, 2023 in U.S. Appl. No. 17/404,477.
Office Action issued Sep. 6, 2023 in U.S. Appl. No. 17/404,492.
Office Action issued Aug. 10, 2023 in U.S. Appl. No. 17/484,407.

*Primary Examiner* — Jia X Pan
(74) *Attorney, Agent, or Firm* — Sughrue Mion, PLLC

(57) ABSTRACT

Provided are a polarizing plate for antireflection including a polarizer, and a protective layer formed on at least one surface of the polarizer, wherein the polarizing plate has a single transmittance of 44.6% or more and a degree of polarization of 98% or more and satisfies $0 \leq [(\text{orthogonal } a^*)^2 + (\text{orthogonal } b^*)^2]^{0.5} \leq 16$, and a display device including the polarizing plate. The polarizing plate for antireflection can exhibit high transmittance while preventing blue-shift phenomenon and having neutral reflection color. Further, the polarizing plate for antireflection can be made thinner.

8 Claims, 1 Drawing Sheet

(51) Int. Cl.
*G02B 1/11* (2015.01)
*G02B 1/14* (2015.01)
*H10K 50/80* (2023.01)

(52) U.S. Cl.
CPC ......... *G02B 5/3083* (2013.01); *H10K 50/868* (2023.02); *B32B 2307/42* (2013.01)

(56) References Cited

U.S. PATENT DOCUMENTS

| | | |
|---|---|---|
| 2016/0259104 A1 | 9/2016 | Lee et al. |
| 2018/0134854 A1 | 5/2018 | Kim et al. |
| 2020/0264460 A1 | 8/2020 | Hatanaka |

FOREIGN PATENT DOCUMENTS

| | | | |
|---|---|---|---|
| JP | 2012-47799 A | | 3/2012 |
| JP | 2015-36729 A | | 2/2015 |
| JP | 2015028634 A | * | 2/2015 |
| JP | 2017-140725 A | | 8/2017 |
| JP | 2019054271 A1 | | 3/2019 |
| JP | 2019-53279 A | | 4/2019 |
| JP | 2020-24364 A | | 2/2020 |
| JP | 2020-122140 A | | 8/2020 |
| KR | 10-2009-0122138 A | | 11/2009 |
| KR | 10-2011-0076179 A | | 7/2011 |
| KR | 20130074942 A | * | 7/2013 |
| KR | 10-2015-0109852 A | | 10/2015 |
| KR | 101775594 B1 | * | 9/2017 |
| KR | 10-2018-0048364 A | | 5/2018 |
| KR | 10-2019-0066562 A | | 6/2019 |
| KR | 20190074227 A | | 6/2019 |
| KR | 10-2019-0083176 A | | 7/2019 |
| KR | 10-2020-0054184 A | | 5/2020 |
| KR | 10-2020-0054185 A | | 5/2020 |
| KR | 10-2020-0091741 A | | 7/2020 |
| KR | 10-2021-0032911 A | | 3/2021 |
| WO | 2011/162259 A1 | | 12/2011 |
| WO | 2017/204161 A1 | | 11/2017 |
| WO | 2019/054275 A1 | | 3/2019 |
| WO | 2020/021847 A1 | | 1/2020 |

* cited by examiner

[FIG. 1]
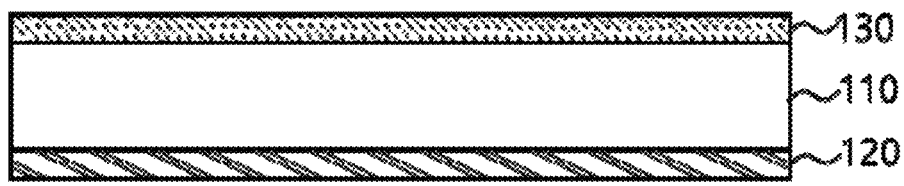
[FIG. 2]
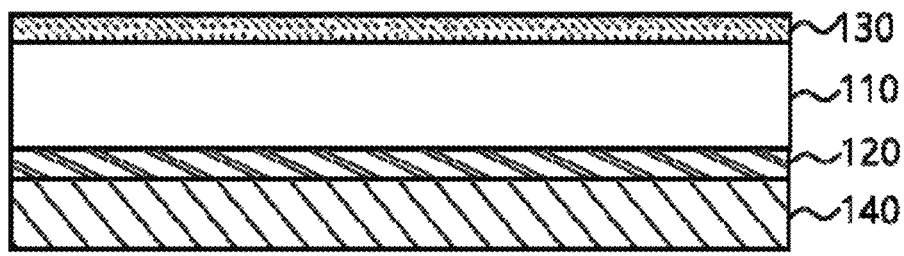
[FIG. 3]
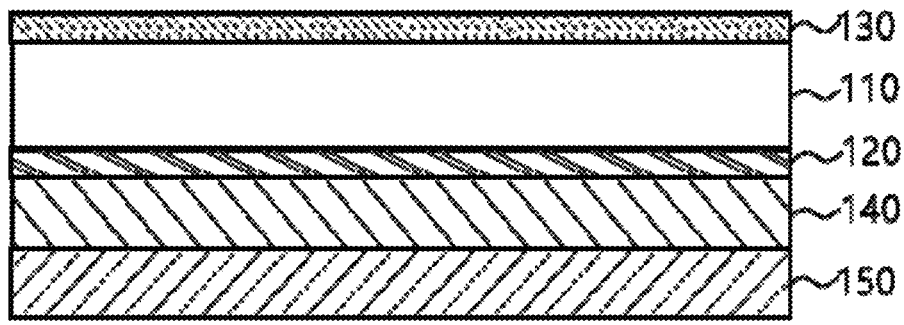
[FIG. 4]
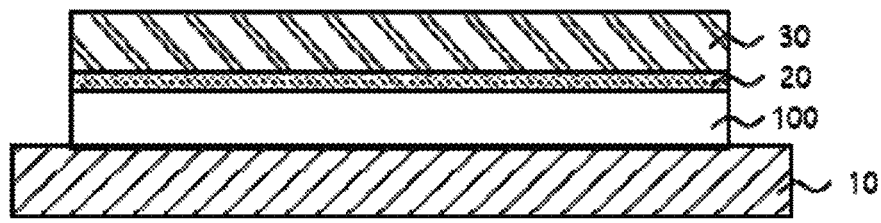

METHOD OF PREPARING A POLARIZING PLATE FOR ANTIREFLECTION

CROSS REFERENCE TO RELATED APPLICATIONS

This application is a Division of U.S. application Ser. No. 17/404,524, filed Aug. 17, 2021, which claims priority based on Korean Patent Application No. 10-2020-0103556, filed Aug. 18, 2020, the content of which is incorporated herein by reference in its entirety.

TECHNICAL FIELD

The present invention relates to a polarizing plate for antireflection and a display device comprising the same. More particularly, the present invention relates to a polarizing plate for antireflection that transmittance is high, blue-shift phenomenon is prevented, reflection color is neutral, and thinning is possible, and a display device comprising the same.

BACKGROUND ART

Organic light-emitting diode (OLED) panels may reflect external light such as sunlight and lighting, due to exposure of electrodes. Therefore, in the organic light-emitting diode (OLED) panel, the reflected external light may lower visibility and contrast ratio, which may deteriorate display quality.

Accordingly, in order to block reflection of external light on the surface in a power-off state and have black visibility, Korean Patent Application Publication No. 2009-0122138 has proposed attaching a circular polarizing plate having a linear polarizer combined with a λ/4 retardation layer on the viewing side of the OLED panel.

However, when the polarizing plate for antireflection is applied in this way, there is a problem in that the luminance of the OLED panel is lowered. Accordingly, it is necessary to improve the transmittance of the polarizing plate for antireflection to minimize the decrease in luminance without deterioration of degree of polarization in order to maintain the inherent performances of the polarizing plate for antireflection.

However, in the case that the transmittance of the polarizing plate for antireflection is high, there is a problem that blue shift phenomenon may occur, and when it is applied to a panel, the display quality is deteriorated because the reflected color is not neutral.

Moreover, as display devices become thinner, there has been a need for thinner polarizing plates.

DISCLOSURE

Technical Problem

It is an object of the present invention to provide a polarizing plate for antireflection in which transmittance is high, blue-shift phenomenon is prevented, reflection color is neutral, and thinning is possible.

It is another object of the present invention to provide a display device comprising the polarizing plate for antireflection.

It is still another object of the present invention is to provide a method for preparing a display device comprising the polarizing plate for antireflection.

Technical Solution

In one aspect, the present invention provides a polarizing plate for antireflection comprising a polarizer, and a protective layer formed on at least one surface of the polarizer, wherein the polarizing plate has a single transmittance of 44.6% or more and a degree of polarization of 98% or more and satisfies Equation 1 below.

$$0 \leq [(\text{orthogonal } a^*)^2 + (\text{orthogonal } b^*)^2]^{0.5} \leq 16 \quad \text{[Equation 1]}$$

wherein,
the orthogonal a* is an a* value of the orthogonal color of the polarizing plate in the L*a*b* color system, and
the orthogonal b* is a b* value of the orthogonal color of the polarizing plate in the L*a*b* color system.

In one aspect, the present invention provides a method of preparing a polarizing plate for antireflection comprising a polarizer, and a protective layer formed on at least one surface of the polarizer,
wherein the polarizing plate has a single transmittance of 44.6% or more and a degree of polarization of 98% or more and satisfies Equation 1 below:

$$0 \leq [(\text{orthogonal } a^*)^2 + (\text{orthogonal } b^*)^2]^{0.5} \leq 16 \quad \text{[Equation 1]}$$

wherein,
the orthogonal a* is an a* value of an orthogonal color of the polarizing plate in L*a*b* color system, and
the orthogonal b* is a b* value of an orthogonal color of the polarizing plate in L*a*b* color system,
wherein the polarizer is prepared by primary drying in a range of 40° C. or more and less than 80° C. followed by secondary drying in a range of 80° C. or more and 105° C. or less, and
wherein the polarizer having the protective layer on at least one surface thereof is prepared by primary drying in a range of 40° C. or more and less than 80° C. followed by secondary drying in a range of 80° C. or more and 105° C. or less.

In one embodiment of the present invention, the polarizer may have a thickness of 8 μm or less.

In one embodiment of the present invention, the polarizer may be prepared by primary drying in a range of 40° C. or more and less than 80° C. followed by secondary drying in a range of 80° C. or more and 105° C. or less.

In one embodiment of the present invention, the polarizer having the protective layer on at least one surface thereof may be prepared by primary drying in a range of 40° C. or more and less than 80° C. followed by secondary drying in a range of 80° C. or more and 105° C. or less.

In one embodiment of the present invention, the polarizing plate for antireflection may further comprise a retardation layer laminated on the opposite side of the viewing side of the polarizer having the protective layer on at least one surface thereof.

In one embodiment of the present invention, the retardation layer may comprise a λ/4 retardation layer.

In one embodiment of the present invention, the retardation layer may be a λ/4 retardation layer; a retardation layer in which a λ/2 retardation layer and a λ/4 retardation layer are laminated sequentially from the viewing side; or a retardation layer in which a λ/4 retardation layer and a positive C plate layer are laminated sequentially from the viewing side.

In one embodiment of the present invention, the polarizing plate for antireflection may further comprise a pressure-sensitive adhesive layer laminated on the opposite side of the viewing side of the retardation layer.

In one embodiment of the present invention, the polarizing plate for antireflection may further comprise a releasable protective film laminated on the viewing side of the polarizer having the protective layer on at least one surface thereof.

In one embodiment of the present invention, the polarizing plate for antireflection may further comprise a release film laminated on the opposite side of the viewing side of the pressure-sensitive adhesive layer.

In another aspect, the present invention provides a display device, comprising the polarizing plate for antireflection; and an OLED panel laminated on the opposite side of the viewing side of the polarizing plate for antireflection.

In still another aspect, the present invention provides a display device, comprising the polarizing plate for antireflection;

an OLED panel laminated on the opposite side of the viewing side of the polarizing plate for antireflection; and a cover window attached on the viewing side of the polarizing plate for antireflection via a transparent adhesive layer.

Advantageous Effects

The polarizing plate for antireflection according to the present invention can exhibit high transmittance, prevent blue-shift phenomenon, and have neutral reflection color. Further, the polarizing plate for antireflection according to the present invention can be made thinner.

BRIEF DESCRIPTION OF DRAWINGS

FIGS. 1 to 3 are cross-sectional views schematically illustrating the polarizing plate for antireflection according to one embodiment of the present invention.

FIG. 4 is a cross-sectional view, schematically illustrating the display device according to one embodiment of the present invention.

BEST MODE

Hereinafter, the present invention will be described in more detail.

The present invention relates to a polarizing plate for antireflection comprising a polarizer, and a protective layer formed on at least one surface of the polarizer, wherein the polarizer has a single transmittance of 44.6% or more and a degree of polarization of 98% or more and satisfies Equation 1 below.

$$0 \leq [(\text{orthogonal } a^*)^2 + (\text{orthogonal } b^*)^2]^{0.5} \leq 16 \quad \text{[Equation 1]}$$

wherein, the orthogonal $a^*$ is an $a^*$ value of an orthogonal color of the polarizing plate in $L^*a^*b^*$ color system, and the orthogonal $b^*$ is a $b^*$ value of an orthogonal color of the polarizing plate in $L^*a^*b^*$ color system.

The single transmittance and the degree of polarization are measured using an UV-Vis spectrophotometer. In this case, the single transmittance and the degree of polarization are defined by Equations 2 and 3 below.

$$\text{Single Transmittance } (Ty) = (T_1 + T_2)/2 \quad \text{[Equation 2]}$$

wherein, $T_1$ is a parallel transmittance obtained when a pair of polarizing plates are arranged in a state in which absorption axes are parallel, and $T_2$ is an orthogonal transmittance obtained when a pair of polarizing plates are arranged in a state in which absorption axes are orthogonal to each other.

$$\text{Degree of Polarization } (P) = [(T_1 - T_2)/(T_1 + T_2)]^{1/2} \times 100 \quad \text{[Equation 3]}$$

wherein, $T_1$ is a parallel transmittance obtained when a pair of polarizing plates are arranged in a state in which absorption axes are parallel, and $T_2$ is an orthogonal transmittance obtained when a pair of polarizing plates are arranged in a state in which absorption axes are orthogonal to each other.

The single transmittance of the polarizing plate is, as described above, 44.6% or more, preferably 44.6% to 45.4%, more preferably 44.6% to 45.2%. If the single transmittance of the polarizing plate is less than 44.6%, the luminance of display may be lowered, and if the single transmittance of the polarizing plate exceeds 45.4%, the initial degree of polarization may be low, and thus the reflectance in a panel state may be increased or the visibility of stains of the polarizing plate may be increased.

The degree of polarization of the polarizing plate is, as described above, 98% or more, preferably 98.2% or more, more preferably 98.4% or more, for example 98.4% to 99.9%. If the degree of polarization of the polarizing plate is less than 98%, antireflection performance may deteriorate.

The polarizing plate according to one embodiment of the present invention satisfies Equation 1 below.

$$0 \leq [(\text{orthogonal } a^*)^2 + (\text{orthogonal } b^*)^2]^{0.5} \leq 16 \quad \text{[Equation 1]}$$

wherein, the orthogonal $a^*$ is an $a^*$ value of an orthogonal color of the polarizing plate in $L^*a^*b^*$ color system, and the orthogonal $b^*$ is a $b^*$ value of an orthogonal color of the polarizing plate in $L^*a^*b^*$ color system.

In a state in which two polarizing plates are superposed so that their absorption axes are orthogonal to each other, when a standard light C is irradiated from one side, the color of the light transmitted from the other side, that is, transmission color is defined as the orthogonal color of the polarizing plate. The orthogonal color may be measured using an UV-Vis spectrophotometer. The $a^*$ and $b^*$ values of the orthogonal color are $a^*$ and $b^*$ values in the $L^*a^*b^*$ color system.

The polarizing plate according to one embodiment of the present invention may implement the reflection color of the polarizing plate as neutral black by satisfying Equation 1 above. When the $[(\text{orthogonal } a^*)^2 + (\text{orthogonal } b^*)^2]^{0.5}$ exceeds 16, it may be difficult to implement the reflection color of the polarizing plate as neutral black.

FIG. 1 is a cross-sectional view schematically illustrating the polarizing plate for antireflection according to one embodiment of the present invention.

Referring to FIG. 1, the polarizing plate for antireflection 100 according to one embodiment of the present invention comprises a polarizer 110, a first protective layer 120 formed on one surface of the polarizer, and a second protective layer 130 formed on the other surface of the polarizer. Although FIG. 1 shows a structure in which the protective layers are laminated on both surfaces of the polarizer, the protective layer may be laminated on only one surface of the polarizer.

The polarizer 110 is prepared by dyeing a hydrophilic polymer film with iodine or a dichroic dye followed by aligning. As the hydrophilic polymer film, a polyvinyl alcohol-based film, a partially saponified polyvinyl alcohol-based film and the like may be used.

The degree of polymerization of the polyvinyl alcohol-based film may be typically 500 to 10,000, preferably 1,000 to 6,000, more preferably 1,400 to 4,000. In the case of the saponified polyvinyl alcohol-based film, the degree of saponification may be preferably 95.0 mol % or more, more preferably 99.0 mol % or more, even more preferably 99.9 mol % or more in terms of solubility.

The type of the hydrophilic polymer film is not particularly limited to the polyvinyl alcohol-based film, as long as the film can be dyed with iodine or a dichroic dye. For example, a hydrophilic polymer film such as a polyethylene terephthalate film, an ethylene-vinyl acetate copolymer film, an ethylene-vinyl alcohol copolymer film, a cellulose film and a partially saponified film thereof; and a polyene alignment film such as a dehydration-treated polyvinyl alcohol-based film and a dehydrochlorination-treated polyvinyl chloride may be used.

The thickness of the polarizer 110 may be 8 μm or less, for example, in the range of 3 to 8 μm, preferably in the range of 5 to 8 μm. If the thickness of the polarizer 110 exceeds 8 μm, it is hard to make the polarizing plate thin, and the degree of the polarization may be lowered in a high transmission region. If the thickness of the polarizer 110 is within the above range, the thinning of the polarizing plate is possible, and shrinkage force due to the shrinkage/expansion of the polarizer in a dry/humid environment can be reduced, thereby minimizing the occurrence of curls. In addition, it is possible to secure a polarizing plate having a degree of the polarization of a certain level or more in the high transmission region.

In one embodiment of the present invention, the polarizer is prepared by an air stretching step, a swelling step, a dyeing step and a crosslinking step, followed by washing and drying.

The air stretching step is a process of dry stretching an unstretched polyvinyl alcohol-based film before entering into a wet process.

As a method of performing the air stretching step, there can be a method of applying tension to a film and rolling by a pressure roll, a method of applying tension to a film and contacting with a heating roll, a method of stretching while applying tension between rolls installed inside or outside a heating oven, a method of compression stretching by passing between two heating rolls, etc.

The air stretching temperature may be 120 to 140° C. When the air stretching temperature satisfies the above range, the degree of stretching in width direction of the raw film may be uniform, and stains which may occur on the surface can be minimized. The air stretching temperature can be adjusted by controlling the temperature of the roll or the oven during stretching.

The stretching ratio in the air stretching step, that is, the air stretching ratio, may be 2.0 to 5.5 times, preferably 3.0 to 4.5 times. When the air stretching ratio satisfies the above range, the degree of stretching in width direction may be uniform, shrinkage stress can be minimized, and the degree of polarization can be increased at a certain transmittance.

The swelling step is a process of immersing the polyvinyl alcohol-based film in a swelling bath filled with an aqueous solution for swelling before dyeing to remove impurities such as dust or anti-blocking agent deposited on the surface of the polyvinyl alcohol-based film, and swelling the polyvinyl alcohol-based film to improve the stretching efficiency and prevent the non-uniformity of dyeing, thereby improving physical properties of the polarizer.

As the aqueous solution for swelling, water (pure water, deionized water) can be used alone, and when a small amount of glycerin or potassium iodide is added thereto, the processability can be improved along with the swelling of the polyvinyl alcohol-based film. It is preferred that the amount of the glycerin is 5% by weight or less and the amount of potassium iodide is 10% by weight or less, based on 100% by weight of the aqueous solution for swelling.

The temperature of the swelling bath is preferably 0 to 45° C., more preferably 10 to 40° C. The performing time of the swelling step (swelling bath immersion time) is preferably 180 seconds or less, more preferably 90 seconds or less. When the immersion time is within the above range, excessive swelling resulting in saturation state can be suppressed, and thus breakage due to softening of the polyvinyl alcohol-based film can be prevented, and adsorption of iodine in the dyeing step can be uniform, thereby improving the degree of polarization.

A stretching step may be performed together with the swelling step, and at this time, the stretching step corresponds to an underwater stretching step.

The swelling step may be omitted, and the swelling may be performed simultaneously in the dyeing step.

The dyeing step is a step of adsorbing iodine onto the polyvinyl alcohol-based film by immersing the polyvinyl alcohol-based film in a dyeing bath filled with an aqueous solution for dyeing containing a dichroic dye, for example, iodine.

The aqueous solution for dyeing may include water, a water-soluble organic solvent, or a mixed solvent thereof, and iodine. The amount of the iodine is preferably 0.4 to 400 mmol/L, more preferably 0.8 to 275 mmol/L, and still more preferably 1 to 200 mmol/L.

In order to further improve the dyeing efficiency, an iodide may be further included as a solubilizing agent. As the iodide, potassium iodide, lithium iodide, sodium iodide, zinc iodide, aluminum iodide, lead iodide, copper iodide, barium iodide, calcium iodide, tin iodide, titanium iodide and the like can be used alone or in combination of two or more. Among them, potassium iodide is preferred in view of its high solubility in water. The amount of the iodide is preferably 0.01 to 10% by weight, more preferably 0.1 to 5% by weight, based on 100% by weight of the aqueous solution for dyeing.

The temperature of the dyeing bath is preferably 5 to 42° C., more preferably 10 to 38° C. The immersion time of the polyvinyl alcohol-based film in the dyeing bath is not particularly limited, but is preferably 0.5 to 20 minutes, more preferably 2 to 10 minutes.

A stretching step may be performed together with the dyeing step, and at this time, the stretching step corresponds to an underwater stretching step.

The crosslinking step is a step of fixing the adsorbed iodine molecules or dyes by immersing the dyed polyvinyl alcohol-based film in an aqueous solution for crosslinking so that the dyeing property by physically adsorbed iodine molecules or dichroic dyes is not deteriorated by an external environment. Although the dichroic dye is not often eluted under moist-resistant condition, the iodine molecules may be often dissolved or sublimated depending on the environment when the crosslinking reaction is unstable, so that sufficient crosslinking reaction is required. In addition, the crosslinking step is important since the polyvinyl alcohol molecules should be stretched at the largest stretching ratio in order to improve optical properties by aligning all polyvinyl alcohol molecules and iodine molecules located between the molecules.

The aqueous solution for crosslinking includes water as a solvent; a boron compound such as boric acid and sodium borate; and an iodide, and may further include an organic solvent which is mutually soluble with water.

The boron compound serves to suppress the occurrence of wrinkles during the process by imparting short crosslinking and rigidity to improve workability and form iodine aligning.

The amount of the boron compound is preferably 1 to 10% by weight, more preferably 2 to 6% by weight, based on 100% by weight of the aqueous solution for crosslinking. If the amount is less than 1% by weight, the crosslinking effect of the boron compound is reduced, making it difficult to impart rigidity. If the amount exceeds 10% by weight, the crosslinking reaction of the inorganic crosslinking agent is excessively activated, so that it is difficult to effectively proceed with the crosslinking reaction of the organic crosslinking agent.

The iodide is used for the uniformity of the degree of polarization in the plane of the polarizer and the prevention of the desorption of the dyed iodine. The iodide may be the same as that used in the dyeing step, and its amount may be 0.05 to 15% by weight, preferably 0.5 to 11% by weight, based on 100% by weight of the aqueous solution for crosslinking. If the amount is less than 0.05% by weight, the iodide ions in the film get out of the film, thereby increasing the transmittance and changing the color value of the polarizer, so that an additional process is required for its control. If the amount exceeds 15% by weight, there is a problem that the iodide ions in the aqueous solution penetrate into the film, thereby lowering the transmittance.

The temperature of the crosslinking bath may be 20 to 70° C., and the immersion time of the polyvinyl alcohol-based film in the crosslinking bath may be 1 second to 15 minutes, preferably 5 seconds to 10 minutes.

A stretching step may be performed together with the crosslinking step, and at this time, the stretching step corresponds to an underwater stretching step.

As described above, the stretching step may be performed together with the swelling step, the dyeing step and/or the crosslinking step, and may be performed as an independent stretching step using a separate stretching bath filled with an aqueous solution for stretching after the crosslinking step. In this case, the stretching step corresponds to an underwater stretching step.

The polarizer may be prepared by controlling the underwater stretching rate/air stretching rate to 0.15 to 0.3 in the stretching step. If the underwater stretching rate/air stretching rate is less than 0.15, the occurrence of breakage during air stretching may increase. If it exceeds 0.3, optical property dispersion and absorption axis dispersion may increase.

The stretching rate is defined by Equation 4 below.

$$\text{Stretching rate (\%)} = [(A_2 - A_1)/A_1] \times 100 \quad \text{[Equation 4]}$$

wherein, $A_1$ is the length of the polarizer before stretching, $A_2$ is the length of the polarizer after stretching.

The underwater stretching rate means cumulative stretching rate of all underwater stretchings.

The washing step is a step of immersing the polyvinyl alcohol-based film after crosslinking and stretching into a washing bath filled with an aqueous solution for washing to remove unnecessary residues such as boric acid attached on the polyvinyl alcohol-based film during the previous steps.

The aqueous solution for washing may be water, and an iodide may be further added thereto.

The temperature of the washing bath is preferably 5 to 60° C., more preferably 8 to 40° C. The performing time of the washing step is typically 1 to 60 seconds, preferably 3 to 30 seconds, and more preferably 5 to 20 seconds.

The washing step may be carried out each time the previous step such as the dyeing step, crosslinking step or stretching step is completed. Further, the washing step may be repeated one or more times, and the number of repetitions is not particularly limited.

The drying step is a step of drying the washed polyvinyl alcohol-based film and further improving the alignment of iodine molecules dyed by neck-in due to drying to obtain a polarizer having excellent optical properties.

As a drying method, methods such as natural drying, air drying, heat drying, far-infrared drying, microwave drying, and hot air drying can be used. Recently, microwave drying in which only water in the film is activated and dried has been newly used, and the mainly used method is hot air drying.

The polarizer may be prepared by primary drying in a range of 40° C. or more and less than 80° C. and secondary drying in a range of 80° C. or more and 105° C. or less to satisfy the Equation 1 above. That is, the drying temperature of the polarizer may have a temperature gradient from low temperature to high temperature.

If the primary drying temperature of the polarizer is less than 40° C., the polarizer may be cut or the quality deterioration such as water stains may occur, and if it is 80° C. or more, the polarizer may turn blue, the degree of polarization may be lowered, or stains may occur due to deterioration by heat and moist.

If the secondary drying temperature of the polarizer is less than 80° C., the curl may be worsened after the polarizer is adhered to the protective layer, or the polarizer may turn blue, and if it exceeds 105° C., the curl may be worsened after the polarizer is adhered to the protective layer, or the polarizer may turn yellow.

The primary drying time of the polarizer may be 5 seconds to 30 seconds. If the primary drying time of the polarizer is less than 5 seconds, the polarizer may be cut, or the quality deterioration such as water stains may occur, and if it exceeds 30 seconds, the curl may be worsened after the polarizer is adhered to the protective layer, or the color of the polarizer may become abnormal.

The secondary drying time of the polarizer may be 30 seconds to 180 seconds. If the secondary drying time of the polarizer is less than 30 seconds, the curl may be worsened after the polarizer is adhered to the protective layer, or the color of the polarizer may become abnormal, and if it exceeds 180 seconds, the curl may be worsened after the polarizer is adhered to the protective layer, or the color of the polarizer may become abnormal.

After the secondary drying, the polarizer may be additionally subjected to tertiary drying for curl control. The tertiary drying may be performed in a range of 40° C. or higher and 105° C. or lower. If the tertiary drying temperature is less than 40° C., it may be difficult to control curls after the polarizer is adhered to the protective layer, and if it exceeds 105° C., the color of the polarizer may become abnormal.

The tertiary drying time of the polarizer may be 5 seconds to 30 seconds. If the tertiary drying time of the polarizer is less than 5 seconds, the drying time may be too short to control the moisture content of the polarizer by tertiary drying, and if it exceeds 30 seconds, the moisture content may be excessively low, so that the curl may be worsened after the polarizer is adhered to the protective layer.

The first protective layer 120 and the second protective layer 130 are attached on both surfaces of the polarizer so as to serve to protect the polarizer 110.

As the first protective layer 120 and the second protective layer 130, any film may be used without particular limitation as long as it has excellent transparency, mechanical strength, thermal stability, moisture barrier property, isotropy and the like. Specifically, a film composed of a thermoplastic resin such as polyester-based resins such as polyethylene terephthalate, polyethylene isophthalate and polybutylene terephthalate; cellulose-based resins such as diacetyl cellulose and triacetyl cellulose; polycarbonate-based resins; acrylic resins such as polymethyl (meth)acrylate and polyethyl(meth)acrylate; styrene-based resins such as polystyrene and acrylonitrile-styrene copolymer; polyolefin-based resins such as polyethylene, polypropylene, polyolefin having a cyclo-based or norbornene structure, and an ethylene-propylene copolymer; vinyl chloride-based resins; polyamide-based resins such as nylon and aromatic polyamide; imide-based resins; polyether sulfone-based resins; sulfone-based resins; polyether ketone-based resins; polyphenylene sulfide-based resins; vinyl alcohol-based resins; vinylidene chloride-based resins; vinyl butyral-based resins; allylate-based resins; polyoxymethylene-based resins; and epoxy-based resins may be exemplified, and a film composed of a blend of the thermoplastic resins can also be used. In addition, a film composed of a thermosetting resin such as (meth)acrylic, urethane-based, epoxy-based, or silicone-based resin or an ultraviolet curable resin may be used. Among them, a cellulose-based film having a surface which is saponified by alkali or the like or an acrylic film is preferred considering polarization properties or durability.

Each of the first protective layer 120 and the second protective layer 130 may have a thickness of 10 to 60 μm, preferably 13 to 25 μm. In addition, the thickness of the first protective layer 120 and the second protective layer 130 may be the same or different. If the thicknesses of the first protective layer 120 and the second protective layer 130 are less than 10 μm, the quality of the polarizing plate may be deteriorated by an external impact, and if they exceed 60 μm, it is difficult to implement a thin film, and the curl of the polarizer may deteriorate due to shrinkage/expansion of the protective layer itself.

The surfaces of the first protective layer 120 and the second protective layer 130 to be adhered to the polarizer may be treated for easy adherence. Examples of the treatment for easy adherence may include dry treatment such as primer treatment, plasma treatment and corona treatment, chemical treatment such as alkali treatment (saponification treatment), and coating treatment for easily forming an adhesive layer.

The first protective layer 120 and the second protective layer 130 may be adhered using an adhesive.

As the adhesive, any suitable adhesive may be used, and materials having excellent transparency, thermal stability, low birefringence and the like are preferred. Specific examples may include water-based adhesives, thermoplastic adhesives, hot-melt adhesives, rubber-based adhesives, thermosetting adhesives, monomer reactive adhesives, inorganic adhesives, and natural adhesives. In view of excellent optical transparency, weather resistance and heat resistance, preferred examples may include a monomer reactive adhesive containing an aliphatic isocyanate as a main component "Takenate 631" (trade name, manufactured by Mitsui Takeda Chemicals), and water-based adhesive containing a modified polyvinyl alcohol having an acetoacetyl group as a main component "GOHSEFIMER Z series" (trade name, manufactured by Nippon Synthetic Chemical Industry).

The thickness of the adhesive layer may be appropriately determined according to the type of resin serving as adhesive, adhesive strength, the environment where the adhesive is used, and the like. The adhesive layer preferably has a thickness of 0.01 μm to 50 μm, more preferably 0.05 μm to 20 μm, and still more preferably 0.1 μm to 10 μm.

The adhering method may be a conventional method in the art, and for example, a method of applying an adhesive composition on the adhering surface of the polarizer or the protective layer using a casting method, a meyer bar coating method, a gravure coating method, a die coating method, a dip coating method, a spray coating method, etc., and then adhering them. The casting method is an application method of flowing down the adhesive composition on the adhering surface while moving the polarizer or the protective layer generally in a vertical direction, a horizontal direction, or an oblique direction between the vertical and horizontal directions. After the adhesive composition is applied, the polarizer and protective layer are inserted between nip rolls and the like and adhered.

After the adherence, a drying treatment may be performed. For example, the drying treatment after the adherence may be performed by applying hot air.

The polarizer having the first protective layer 120 and the second protective layer 130 obtained after the adherence, that is, the polarizing plate may be prepared by subjecting it to a primary drying in a range of 40° C. or higher and less than 80° C. followed by a secondary drying in a range of 80° C. or higher and 105° C. or lower to satisfy the Equation 1 above. That is, the drying temperature of the polarizer having the first protective layer 120 and the second protective layer 130 may have a temperature gradient from low temperature to high temperature.

If the primary drying temperature of the polarizer having the first protective layer 120 and the second protective layer 130 is less than 40° C., the adhesive between the protective layer and the polarizer cannot exhibit sufficient adhesion, and thus bubbles may occur. If it is 80° C. or higher, the adhesive between the protective layer and the polarizer may deteriorate due to moist-heat, which may lower the degree of polarization or cause the color change of the polarizing plate to blue.

If the secondary drying temperature of the polarizer having the first protective layer 120 and the second protective layer 130 is less than 80° C., the curl may be worsened or the color of the polarizing plate may turn blue, and if it exceeds 105° C., the curl may be worsened or the color of the polarizing plate may turn red.

The primary drying time of the polarizer having the first protective layer 120 and the second protective layer 130 may be 5 seconds to 30 seconds. If the primary drying time of the polarizer having the first protective layer 120 and the second protective layer 130 is less than 5 seconds, bubbles or gap may occur when passing through a guide roll due to insufficient adhesion between the protective layer and the polarizer. If it is more than 30 seconds, there may be problems that the polarization performance deteriorates or stains occur since the time for the adhesive to stay at a low temperature in a state in which it is not sufficiently cured becomes longer.

The secondary drying time of the polarizer having the first protective layer 120 and the second protective layer 130 may be 30 seconds to 180 seconds. If the secondary drying time of the polarizer having the first protective layer 120 and the second protective layer 130 is less than 30 seconds, the adhesion between the protective layer and the polarizer may decrease, and if it exceeds 180 seconds, the moisture content of the polarizing plate may be insufficient, so that the curl may be worsened.

The polarizer having the first protective layer 120 and the second protective layer 130 may be additionally subjected to tertiary drying for curl control after the secondary drying.

The tertiary drying may be performed in a range of 40° C. or higher and 105° C. or lower. If the tertiary drying temperature is less than 40° C., it may be difficult to adjust the moisture content of the polarizing plate, so that it may be difficult to control the curls, and if it exceeds 105° C., the moisture content of the polarizing plate is excessively lowered and thus the curl may be worsened, or the color of the polarizing plate may turn red due to the high drying temperature.

The tertiary drying time of the polarizer having the first protective layer 120 and the second protective layer 130 may be 5 seconds to 30 seconds. If the tertiary drying time of the polarizer having the first protective layer 120 and the second protective layer 130 is less than 5 seconds, it may be difficult to adjust the moisture content, so that it may be difficult to control the curls, and if it exceeds 30 seconds, the curl may be worsened.

After drying, it is preferred to perform curing at room temperature or a temperature slightly higher than that, for example, at a temperature of 20 to 50° C., for 12 to 600 hours.

The polarizing plate for antireflection according to one embodiment of the present invention, a retardation layer 140 may be further laminated on the opposite side of the viewing side of the polarizer 110 having the first protective layer 120 and second protective layer 130, as shown in FIG. 2.

The retardation layer 140 may be, for example, a stretched or unstretched polymer film, or a liquid crystal layer formed by curing a reactive mesogen.

For example, in the case that the retardation layer 140 is made of a liquid crystal layer, a reactive mesogen (RM) which is a liquid crystal compound having optical anisotropy and crosslinking property by light or heat may be used.

The retardation layer 140 comprises a $\lambda/4$ retardation layer.

The $\lambda/4$ retardation layer can convert incident linearly polarized light to elliptically polarized light or circularly polarized light, or conversely, can convert incident elliptically polarized light or circularly polarized light to linearly polarized light. Accordingly, the $\lambda/4$ retardation layer can be applied to an OLED panel to prevent reflection of external light, and thus it is possible to implement black visibility in a power-off state.

The retardation layer 140 may have a single-layer structure or a multi-layer structure in which 2 or more layers are laminated. When the retardation layer 140 has a single-layer structure, the retardation layer 140 may consist of a $\lambda/4$ retardation layer. When the retardation layer 140 has a multi-layer structure, the retardation layer 140 essentially comprises a $\lambda/4$ retardation layer, and may further comprise at least one of a $\lambda/2$ retardation layer or a positive C plate layer. The $\lambda/2$ retardation layer and the positive C plate layer can be used to improve black visibility of the reflection color.

For example, the polarizing plate for antireflection according to one embodiment of the present invention has a structure where a second protective layer, a polarizer, a first protective layer and a $\lambda/4$ retardation layer are laminated sequentially from the viewing side; a structure where a second protective layer, a polarizer, a first protective layer, a $\lambda/2$ retardation layer and a $\lambda/4$ retardation layer are laminated sequentially from the viewing side; or a structure where a second protective layer, a polarizer, a first protective layer, a $\lambda/4$ retardation layer and a positive C plate layer are laminated sequentially from the viewing side.

At this time, each layer constituting the retardation layer may be attached to each other via a PSA (pressure-sensitive adhesive)/adhesive or may be laminated on each other by direct coating.

In addition, the polarizer 110 comprising the first protective layer 120 and the second protective layer 130 may be adhered to the retardation layer 130 using a PSA/adhesive.

As the PSA/adhesive, various PSAs or adhesives known in the art may be used without particular limitation.

For example, as the pressure-sensitive adhesive (PSA), a rubber-based PSA, an acrylic-based PSA, a silicone-based PSA, a urethane-based PSA, a polyvinyl alcohol-based PSA, a polyvinylpyrrolidone-based PSA, a polyacrylamide-based PSA, a cellulose-based PSA, a vinyl alkyl ether-based PSA and the like may be used.

Also, as the adhesive, a photocurable adhesive may be exemplified, but the type of the adhesive is not particularly limited.

The photocurable adhesive is crosslinked and cured by active energy rays such as ultraviolet (UV) and electron beam (EB) to exhibit strong adhesion, and may comprise a reactive oligomer, a reactive monomer, a photopolymerization initiator and the like.

The reactive oligomer is an important component which determines the properties of the adhesive, and forms a polymer bond by photopolymerization to form a cured film. As the reactive oligomer, a polyester-based resin, a polyether-based resin, a polyurethane-based resin, an epoxy-based resin, a polyacrylic-based resin, a silicone-based resin and the like can be used.

The reactive monomer serves as a crosslinking agent and a diluent for the reactive oligomer described above and affects adhesion properties. As the reactive monomer, a monofunctional monomer, a polyfunctional monomer, an epoxy-based monomer, vinyl ethers, cyclic ethers and the like can be used.

The photopolymerization initiator initiates photopolymerization by absorbing light energy to generate radicals or cations, and a suitable one may be selected and used depending on the photopolymerization resin.

In addition, as shown in FIG. 3, the pressure-sensitive adhesive (PSA) layer 150 may be further laminated on the opposite side of the viewing side of the retardation layer 140. The PSA layer 150 serves to attach the polarizing plate for antireflection 100 to the OLED panel 10, or the PSA layer 150 may be attached to a touch panel (not shown).

The PSA layer 150 may be formed using various PSAs known in the art without particular limitation.

For example, as the PSA, a rubber-based PSA, an acrylic-based PSA, a silicone-based PSA, a urethane-based PSA, a polyvinyl alcohol-based PSA, a polyvinylpyrrolidone-based PSA, a polyacrylamide-based PSA, a cellulose-based PSA, a vinyl alkyl ether-based PSA and the like may be used.

The thickness of the PSA layer 150 is preferably 5 to 30 μm, while it is preferred to apply as thin as possible within the range which does not impair workability and durability. More preferably, the thickness is 10 to 25 μm. If the thickness of the PSA layer 150 is less than 5 μm, defects may be recognized as dents and damages in the panel cannot be filled. If the thickness exceeds 30 μm, it may be difficult to attain the thinning of the polarizing plate.

The polarizing plate for antireflection according to one embodiment of the present invention may have a releasable protective film (not shown) laminated on the viewing side of the polarizer 110 having the first protective layer 120 and second protective layer 130.

The releasable protective film comprises a substrate, and a pressure-sensitive adhesive layer formed on one side of the substrate. The pressure-sensitive adhesive layer is attached to the polarizer having protective layers, and when the polarizing plate is attached to a cover window, the pressure-sensitive adhesive layer is released from the polarizer having protective layers, thereby easily removing the protective film. The material of the pressure-sensitive adhesive layer may be the same as the above-exemplified pressure-sensitive adhesive.

The substrate of the protective film may be a polyester film such as polyethylene terephthalate, polybutylene terephthalate and polyethylene naphthalate; or a polyolefin film such as polypropylene and polyethylene.

The thickness of the protective film may be 10 to 150 μm, preferably 25 to 130 μm. If the thickness of the protective film is less than 10 μm, it may be difficult to release the protective film, and if the thickness exceeds 150 μm, the adhesion with the polarizer having protective layers may be lowered.

Further, the polarizing plate for antireflection according to one embodiment of the present invention may have a release film (not shown) laminated on the opposite side of the viewing side of the pressure-sensitive adhesive layer 150.

The release film is removed when the polarizing plate for antireflection is attached to the OLED panel.

The substrate of the release film may be a polyester film such as polyethylene terephithalate, polybutylene terephthalate and polyethylene naphthalate; or a polyolefin film such as polypropylene and polyethylene.

In the substrate of the release film, the surface which contacts with the pressure-sensitive adhesive layer 150 may be release-treated. The release-treatment may be performed by a method of surface treatment using a release agent such as a silicone-based release agent, a fluorine-based release agent, and a long-chain alkyl grafted polymer-based release agent, or plasma treatment.

The thickness of the release film may be 10 to 150 μm, preferably 25 to 130 μm. If the thickness of the release film is less than 10 μm, it may be difficult to release the release film, and if the thickness exceeds 150 μm, the adhesion with the pressure-sensitive adhesive layer 150 may be lowered.

The total thickness of the polarizing plate for antireflection according to the present invention may be 100 μm or less, for example 20 to 100 μm, preferably 30 to 80 μm, more preferably 30 to 60 μm. Herein, the total thickness of the polarizing plate for antireflection is the thickness excluding the thickness of the releasable protective film and the release film.

One embodiment of the present invention relates to a display device comprising the polarizing plate for antireflection 100.

Referring to FIG. 4, the display device according to one embodiment of the present invention comprises the polarizing plate for antireflection 100; and an OLED panel 10 laminated on the opposite side of the viewing side of the polarizing plate for antireflection 100.

In addition, as shown in FIG. 4, the display device according to one embodiment of the present invention may comprise a cover window 30 attached on the viewing side of the polarizing plate for antireflection 100 via a transparent adhesive layer 20.

The transparent adhesive layer 20 may comprise, for example, a pressure-sensitive adhesive (PSA)/adhesive such as an optically clear adhesive (OCA), an optically clear resin (OCR), etc.

The cover window 30 may be made of a material having durability against external impact and transparency for user visibility. For example, the cover window 30 may be a glass or a polymer film having flexibility. The glass may include a glass material in which flexible properties are implemented. Examples of the polymer film having flexibility may include polyimide (PI), polyethersulphone (PES), polyacrylate (PAR), polyetherimide (PEI), polyethylene napthalate (PEN), polyethylene terephthalate (PET), polyphenylene sulfide (PPS), polyarylate, polycarbonate (PC), cellulose triacetate (TAC), cellulose acetate propionate (CAP), and the like. The polymer film having flexibility may have a hard coating layer formed on at least one side thereof. The hard coating layer may be formed using hard coating compositions known in the art.

The display device according to one embodiment of the present invention may be an organic EL display device and may be in the form of a conventional flat panel display, flexible display or foldable display.

Hereinafter, the present invention will be described in more detail by way of Examples and Experimental Examples. However, these Examples and Experimental Examples are given for illustrative purposes only, and it is apparent to those skilled in the art that the scope of the invention is not intended to be limited by these Examples and Experimental Examples.

Preparation Examples 1 to 10 and Comparative Preparation Examples 1 to 10: Preparation of Polarizer A 20 μm-thick polyvinyl alcohol resin film (Kuraray Co., Ltd.) having an average degree of polymerization of about 2,400 and a degree of hydrolysis of 99.9 mol % or more was uniaxially stretched 4.0 times in the air on a hot roll of 130° C. After that, it was immersed in distilled water for swelling, immersed in an aqueous solution of iodine/potassium iodide/water in a weight ratio of 15/5/100 at 30° C. for 30 seconds, and then immersed in an aqueous solution of potassium iodide/boric acid/water in a weight ratio of 10/5/100 at 53° C. for 1 minutes while uniaxially stretching in the water so that the underwater stretching rate/air stretching rate becomes 0.2. Then, after washing with pure water at 15° C. for 1.5 seconds, primary, secondary and optionally tertiary dryings were carried out at each drying temperature as shown in Table 1 below to obtain an 8 μm-thick polarizer in which the iodine is adsorbed and aligned on the polyvinyl alcohol. At this time, the primary, secondary and optionally tertiary drying were performed for 10 seconds, 120 seconds and 10 seconds, respectively.

Examples 1 to 10 and Comparative Examples 1 to 10: Manufacture of Polarizing Plate According to the following method, a polarizing plate with the same structure as in the embodiment of FIG. 1 was manufactured.

A 25 μm-thick TAC film as the first protective layer 120 was adhered onto the opposite side of the viewing side of the polarizer 110 prepared in Preparation Examples and Comparative Preparation Examples using a water-based adhesive. Then, a 32 μm-thick TAC film having a hard coating layer as the second protective layer was adhered onto the viewing side of the polarizer 110 using a water-based adhesive. As the water-based adhesive, a thermosetting water-based PVA adhesive was used.

After that, the polarizer having the protective layers was subjected to primary, secondary and optionally tertiary drying steps at each drying temperature as shown in Table 1 below to obtain a polarizing plate. At this time, the primary, secondary and optionally tertiary drying were performed for 20 seconds, 120 seconds and 20 seconds, respectively.

Experimental Example

The properties of the polarizing plates prepared in the Examples and Comparative Examples were measured by the following methods, and the results are shown in Table 1 below.

(1) Single Transmittance and Degree of Polarization

The polarizing plate of the Examples and Comparative Examples was cut into a size of 4 cm×4 cm, and the transmittance was measured using a UV-Vis spectrophotometer (V-7100, manufactured by JASCO Inc.). Herein, the single transmittance and the degree of polarization are defined as Equations 2 and 3 below.

$$\text{Single Transmittance } (Ty) = (T_1 + T_2)/2 \quad \text{[Equation 2]}$$

wherein, $T_1$ is a parallel transmittance obtained when a pair of polarizing plates are arranged in a state in which absorption axes are parallel, and $T_2$ is an orthogonal transmittance obtained when a pair of polarizing plates are arranged in a state in which absorption axes are orthogonal to each other.

$$\text{Degree of Polarization } (P) = [(T_1 - T_2)/(T_1 + T_2)]^{1/2} \times 100 \quad \text{[Equation 3]}$$

wherein, $T_1$ is a parallel transmittance obtained when a pair of polarizing plates are arranged in a state in which absorption axes are parallel, and $T_2$ is an orthogonal transmittance obtained when a pair of polarizing plates are arranged in a state in which absorption axes are orthogonal to each other.

(2) Transmission Color of Polarizing Plate

In a state in which two polarizing plates of the Examples and Comparative Examples were superposed so that their absorption axes are orthogonal to each other, a standard light C was irradiated from one side, and the color of the light transmitted from the other side was measured using an UV-Vis spectrophotometer (V-7100, manufactured by JASCO Inc.). A value defined by Equation 5 below was calculated.

$$[(\text{orthogonal } a^*)^2 + (\text{orthogonal } b^*)^2]^{0.5} \quad \text{[Equation 5]}$$

wherein,
the orthogonal a* is an a* value of the orthogonal color of the polarizing plate in the L*a*b* color system, and
the orthogonal b* is a b* value of the orthogonal color of the polarizing plate in the L*a*b* color system.

(3) Reflection Color

After sequentially laminating a retardation layer and a pressure-sensitive adhesive layer on the opposite side of the viewing side of the polarizing plate of the Examples and Comparative Examples, a reflector made of aluminum material having a total reflectance of 96% or more was attached onto the surface of the pressure-sensitive adhesive layer, and then the reflection color of the polarizing plate was visually confirmed under a three-wavelength lamp. At this time, as the retardation layer, a 2 μm-thick λ/2 retardation layer (discotic liquid crystal layer) and an 1 μm-thick λ/4 retardation layer (nematic liquid crystal layer) which were adhered sequentially from the viewing side using a ultraviolet curable adhesive (ADEKA, OX-154D) were used (Fuji Corporation). As the pressure-sensitive adhesive layer, a 15 μm-thick acrylic pressure-sensitive adhesive (Lintec Corporation) was used.

TABLE 1

| Content | Polarizer drying temp. | | | Polarizing plate drying temp. | | | Single transmittance (%) | Degree of polarization (%) | Polarizing plate transmission color | Reflection color |
|---|---|---|---|---|---|---|---|---|---|---|
| | Primary | Secondary | Tertiary | Primary | Secondary | Tertiary | | | | |
| Example 1 | 40° C. | 85° C. | — | 50° C. | 80° C. | 55° C. | 44.9 | 98.8 | 8.0 | Black |
| Example 2 | 40° C. | 100° C. | — | 50° C. | 80° C. | 55° C. | 44.8 | 98.9 | 10.7 | Black |
| Example 3 | 40° C. | 105° C. | — | 50° C. | 80° C. | 55° C. | 44.9 | 98.5 | 13.3 | Black |
| Example 4 | 70° C. | 105° C. | — | 50° C. | 80° C. | 55° C. | 44.8 | 98.3 | 14.5 | Black |
| Example 5 | 40° C. | 85° C. | 105° C. | 50° C. | 80° C. | 55° C. | 44.7 | 98.8 | 8.1 | Black |
| Example 6 | 40° C. | 85° C. | 40° C. | 50° C. | 80° C. | 55° C. | 44.8 | 98.9 | 6.3 | Black |
| Example 7 | 40° C. | 85° C. | — | 50° C. | 105° C. | — | 44.9 | 98.4 | 12.6 | Black |
| Example 8 | 40° C. | 85° C. | — | 40° C. | 80° C. | — | 44.7 | 98.8 | 4.7 | Black |
| Example 9 | 40° C. | 85° C. | — | 70° C. | 80° C. | — | 44.8 | 98.7 | 7.4 | Black |
| Example 10 | 40° C. | 85° C. | — | 70° C. | 105° C. | — | 44.9 | 98.4 | 9.9 | Black |
| Com. Ex. 1 | 40° C. | 40° C. | — | 50° C. | 80° C. | 55° C. | 44.9 | 98.4 | 18.1 | Green |
| Com. Ex. 2 | 105° C. | 60° C. | 40° C. | 50° C. | 80° C. | 55° C. | 44.9 | 98.4 | 18.0 | Blue |
| Com. Ex. 3 | 105° C. | 80° C. | — | 50° C. | 80° C. | 55° C. | 44.9 | 98.1 | 17.8 | Blue |
| Com. Ex. 4 | 105° C. | 105° C. | — | 50° C. | 80° C. | 55° C. | 44.9 | 93.7 | 21.7 | Blue |
| Com. Ex. 5 | 80° C. | 80° C. | — | 50° C. | 80° C. | 55° C. | 44.7 | 98.1 | 18.2 | Blue |
| Com. Ex. 6 | 40° C. | 85° C. | — | 80° C. | 80° C. | 80° C. | 44.8 | 98.5 | 17.8 | Blue |
| Com. Ex. 7 | 40° C. | 85° C. | — | 80° C. | 105° C. | — | 44.7 | 98.4 | 17.5 | Violet |
| Com. Ex. 8 | 40° C. | 85° C. | — | 105° C. | 80° C. | — | 44.8 | 98.2 | 21.8 | Blue |
| Com. Ex. 9 | 40° C. | 85° C. | — | 105° C. | 105° C. | — | 45.1 | 98.1 | 24.0 | Violet |
| Com. Ex. 10 | 40° C. | 85° C. | — | 40° C. | 40° C. | 40° C. | 44.6 | 98.5 | 19.0 | Green |

As shown in Table 1, in the case of the polarizing plates of Examples 1 to 10 satisfying Equation 1 below according to the present invention, the transmittance was high, the blue-shift phenomenon was prevented, and the reflection color was neutral.

$$0 \leq [(\text{orthogonal } a^*)^2 + (\text{orthogonal } b^*)^2]^{0.5} \leq 16 \quad \text{[Equation 1]}$$

wherein,
the orthogonal a* is an a* value of the orthogonal color of the polarizing plate in the L*a*b* color system, and the orthogonal b* is a b* value of the orthogonal color of the polarizing plate in the L*a*b* color system.

On the other hand, the polarizing plates of Comparative Examples 1 to 10 not satisfying Equation 1 above exhibited high transmittance, but the blue-shift phenomenon occurred, and the reflection color was not neutral.

Although specific parts of the present invention have been described in detail, it will be apparent to those skilled in the art that these specific descriptions are merely a preferred embodiment and that the scope of the present invention is not limited thereto. In addition, those skilled in the art will appreciate that various applications and modifications are possible, without departing from the scope and spirit of the invention based on the descriptions above.

Therefore, the substantial scope of the present invention will be defined by the accompanying claims and their equivalents.

DESCRIPTION OF REFERENCE NUMERALS

10: OLED panel
20: transparent adhesive layer
30: cover window
100: polarizing plate for antireflection
110: polarizer
120: first protective layer
130: second protective layer
140: retardation layer
150: pressure-sensitive adhesive layer

The invention claimed is:

1. A method of preparing a polarizing plate for antireflection, the polarizing plate comprising a polarizer and a protective layer formed on at least one surface of the polarizer, wherein the polarizing plate has a single transmittance of 44.6% or more and a degree of polarization of 98% or more and satisfies Equation 1 below:

$$0 \leq [(\text{orthogonal } a^*)^2 + (\text{orthogonal } b^*)^2]^{0.5} \leq 16 \quad \text{[Equation 1]}$$

wherein,
the orthogonal a* is an a* value of an orthogonal color of the polarizing plate in L*a*b* color system, and
the orthogonal b* is a b* value of an orthogonal color of the polarizing plate in L*a*b* color system, the method comprising:
preparing the polarizer by performing a primary drying in a range of 40° C. or more and less than 80° C. followed by a secondary drying in a range of 80° C. or more and 105° C. or less, and
preparing the polarizer having the protective layer on at least one surface thereof by performing a primary drying in a range of 40° C. or more and less than 80° C., followed by a secondary drying in a range of 80° C. or more and 105° C. or less and a tertiary drying in a range of 40° C. or more and 55° C. or less.

2. The method of preparing a polarizing plate for antireflection of claim 1, wherein the polarizer has a thickness of 8 μm or less.

3. The method of preparing a polarizing plate for antireflection of claim 1, wherein the polarizing plate further comprises a retardation layer laminated on an opposite side of a viewing side of the polarizer having the protective layer on at least one surface thereof.

4. The method of preparing a polarizing plate for antireflection of claim 3, wherein the retardation layer comprises a λ/4 retardation layer.

5. The method of preparing a polarizing plate for antireflection of claim 3, wherein the retardation layer is a λ/4 retardation layer; the retardation layer comprises a λ/2 retardation layer and a λ/4 retardation layer which are laminated sequentially from the viewing side; or the retardation layer comprises a λ/4 retardation layer and a positive C plate layer which are laminated sequentially from the viewing side.

6. The method of preparing a polarizing plate for antireflection of claim 3, wherein the polarizing plate further comprises a pressure-sensitive adhesive layer laminated on the opposite side of the viewing side of the retardation layer.

7. The method of preparing a polarizing plate for antireflection of claim 6, wherein the polarizing plate further comprises a release film laminated on the opposite side of the viewing side of the pressure-sensitive adhesive layer.

8. The method of preparing a polarizing plate for antireflection of claim 1, wherein the polarizing plate further comprises a releasable protective film laminated on a viewing side of the polarizer having the protective layer on at least one surface thereof.

* * * * *